(12) United States Patent
Wu et al.

(10) Patent No.: US 8,013,425 B2
(45) Date of Patent: Sep. 6, 2011

(54) SCRIBE LINE STRUCTURE FOR WAFER DICING AND METHOD OF MAKING THE SAME

(75) Inventors: Ping-Chang Wu, Hsin-Chu Hsien (TW); Tsung-Shu Lin, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 352 days.

(21) Appl. No.: 12/119,502

(22) Filed: May 13, 2008

(65) Prior Publication Data

US 2009/0283869 A1  Nov. 19, 2009

(51) Int. Cl.
*H01L 23/544* (2006.01)
(52) U.S. Cl. ................ 257/620; 257/E23.179
(58) Field of Classification Search .............. 257/620, 257/E21.214, E23.179; 438/462
See application file for complete search history.

(56) References Cited

U.S. PATENT DOCUMENTS

| | | | |
|---|---|---|---|
| 5,943,591 A * | 8/1999 | Vokoun et al. | 438/462 |
| 6,951,801 B2 | 10/2005 | Pozder et al. | |
| 2002/0024115 A1* | 2/2002 | Ibnabdeljalil et al. | 257/620 |
| 2005/0230005 A1* | 10/2005 | Liang et al. | 148/33.3 |
| 2007/0069337 A1* | 3/2007 | Kuo et al. | 257/620 |
| 2009/0039470 A1* | 2/2009 | Vo | 257/620 |

OTHER PUBLICATIONS

Kuo et al., "Method for Forming a Metal Structure", U.S. Appl. No. 11/611,888, filed Dec. 17, 2006.

* cited by examiner

*Primary Examiner* — Matthew Smith
*Assistant Examiner* — Daniel Shook
(74) *Attorney, Agent, or Firm* — Winston Hsu; Scott Margo

(57) ABSTRACT

The scribe line structure for wafer dicing according to the present invention includes a plurality of metal structures arranged up-and-down on a substrate in a dielectric layer, and an upper one of the metal structures has a lower metal density than a lower one of the metal structures. In another aspect, the scribe line structure for wafer dicing includes a plurality of metal structures arranged up-and-down on a substrate in a dielectric layer, and each of the metal structures has a lower metal density on a dicing path for the wafer dicing than not on the dicing path. The scribe line structure can effectively avoid interlayer delamination or peeling issue caused by a dicing process, especially on a low-k/Cu wafer.

6 Claims, 7 Drawing Sheets

SCRIBE LINE STRUCTURE FOR WAFER DICING AND METHOD OF MAKING THE SAME

BACKGROUND OF THE INVENTION

1. Field of the Invention

The present invention relates to a semiconductor wafer, and more specifically, to a scribe line structure for wafer dicing and a method of making the same, to avoid interlayer delamination or peeling caused by a sawing process on a low-k/Cu wafer.

2. Description of the Prior Art

With the continued development of semiconductor process technology, and the miniaturization of the integrated circuit chip, many unneeded parasite capacitors are often formed in the inter-metal-dielectric (IMD) layer. Therefore, copper with lower resistance is gradually used in place of aluminum with higher resistance to be the material of the IMD layer, and the low dielectric constant (low-k) materials are gradually used in place of the silicon oxide dielectric materials, such as fluorinated silicate glass (FSG), phosphosilicate glass (PSG), or undoped silicate glass (USG), in order to decrease the resistances of conducting wires for the IMD layer or the dielectric constant of the dielectric layers, so as to mitigate the resistor-capacitor time delay effect.

After the integrated circuits of the semiconductor wafers are manufactured, dicing is the first step in the packaging process. The dicing quality can have a significant impact on yields as well as on device reliability. Dicing wafer with a grinding wheel is a typical method for many IC assembly plants. During the process of dicing, the grinding wheel or the cutter exerts a downward force upon the surface of the wafer. Crack (chipping) is unable to be avoided for the mechanical sawing. Especially, interconnect structures in IC areas have a higher metal density in the upper portion than in the lower portion, and accordingly peeling and interlayer delamination after wafer dicing are often found, which are more serious when the wafer is a low-k/Cu wafer. The term "metal density" used herein relates to an amount of metal distributed in a certain area. This is a result of the properties of the copper and the low-k materials. The copper is fairly hard, and is more difficult to be cut in comparison with other materials in wafers. On the other hand, the low-k materials are soft or are porous structures, and the adhesion between the low-k materials and the other materials is rather poor. As the technology progresses and the scribe line for wafer dicing goes smaller, it is easy for this crack to penetrate active circuits and become a latent reliability problem of the final products.

Some conventional technologies have been used to improve the dicing quality. For example, FIG. 1 schematically shows a cross sectional view of a conventional scribe line structure 1 including a plurality of metal layers 11, also referred to as the scribe area interconnect layers, disposed in a dielectric layer 20 on a substrate 10. The metal layers 11 each have slots 12 uniformly distributed therein with a same pitch distance. The top metal layer 13 is a wholly metal pad. Not all the metal layers are shown, and metal vias (if exist) are skipped over for simplification and easy reading. FIG. 2 schematically shows a cross sectional view of a conventional scribe line structure 2 including a plurality of metal layers 21 and the top metal layer 23 disposed in the dielectric layer 20 on the substrate 10, each having slots 22 uniformly distributed therein. However, both scribe line structures 1 and 2 still cannot avoid a worse dicing result and reliability.

In other examples, FIG. 3 schematically shows a cross sectional view of a conventional scribe line structure 3 including a plurality of sets of metal vias 31 in the dielectric layer 20 on the substrate 10. There may be or may be not metal layers 32 disposed therein. The metal vias 31 are uniformly distributed with a same pitch distance. Not all the metal vias and the metal layers are shown for simplification and easy reading. FIG. 4 schematically shows a cross sectional view of a conventional scribe line structure 4 including a plurality of sets of metal vias 41 in the dielectric layer 20 on the substrate 10. There may be or may be not metal layers 42 disposed therein. Each set of the metal vias 41 has metal uniformly distributed in its own layer. The metal vias 41 are less dense to be disposed in the scribe line structure 4 than the metal vias 31 to be disposed in the scribe line structure 3. However, both scribe line structures 3 and 4 still cannot avoid a worse dicing result and reliability.

In a further example, a method for forming a semiconductor wafer to prevent the peeling and the interlayer delamination of material layers is disclosed in U.S. patent application Ser. No. 11/611,888 (assigned to the same assignee of the present application), in which a metal layer is formed in the low-k dielectric layer in the scribe line area and the metal layer comprises at least a slot parallel to the scribe line area, as shown in FIG. 5, a schematic top view of the metal layer 15 with slots 17 parallel to a dicing direction 9. The slots 17 are uniformly distributed in the metal layer 15.

As to improve reliability of ICs, a novel scribe line structure for wafer dicing and a method of making the same to avoid the interlayer delamination or peeling problem is till needed.

SUMMARY OF THE INVENTION

An objective of the present invention is to provide a scribe line structure for wafer dicing. The scribe line structure on a low-k/Cu wafer may avoid interlayer delamination or peeling caused by a sawing process.

In one aspect of the present invention, the scribe line structure for wafer dicing according to the present invention comprises a substrate, a dielectric layer, and a plurality of metal structures. The dielectric layer is disposed on the substrate. The metal structures are arranged up-and-down on the substrate in the dielectric layer. An upper one of the metal structures has a lower metal density than a lower one of the metal structures.

In another aspect of the present invention, the scribe line structure for wafer dicing comprises a substrate, a dielectric layer, and a plurality of metal structures. The dielectric layer is disposed on the substrate. The metal structures are arranged up-and-down on the substrate in the dielectric layer. Each of the metal structures has a lower metal density on a dicing path for the wafer dicing than not on the dicing path.

In further another aspect of the present invention, the method of making the scribe line structure for wafer dicing according to the present invention comprises steps as follows. First, a substrate is provided. Thereafter, a plurality of dielectric layers is formed to be stacked on the substrate. Metal layers and sets of metal vias are alternately formed in the dielectric layers. The metal layers each have a plurality of slots parallel to a dicing path for the wafer dicing. An upper one of the metal layers has a lower metal density than a lower one of the metal layers.

In still further another aspect of the present invention, the method of making the scribe line structure for wafer dicing according to the present invention comprises steps as follows. First, a substrate is provided. Thereafter, a plurality of dielectric layers is formed to be stacked on the substrate. Metal layers and sets of metal vias are alternately formed in the dielectric layers. Each of sets of metal vias has a lower metal density on a dicing path for the wafer dicing than not on the dicing path.

When the scribe line structure for wafer dicing according to the present invention comprises a plurality of metal structures in which an upper one of the metal structures has a lower metal density than a lower one of the metal structures, the scribe line structure is rendered stiffer in the lower portion than in the upper portion. During the application of a saw blade for dicing the wafer on the top of the scribe line structure, the gradually increased stiffness from top to bottom actively provides an efficient support to prevent the falling of layers upon being pressed in the sawing process, and accordingly interlayer delamination or peeling is avoided.

When the scribe line structure for wafer dicing according to the present invention comprises a plurality of metal structures in which each of the metal structures has a lower metal density on a dicing path for the wafer dicing than not on the dicing path, the scribe line structure is rendered stiffer in the portion not on the dicing path than the portion on the dicing path. During the application of a saw blade for dicing the wafer on the dicing path of the wafer, the portion not on the dicing path provides stress retardation to prevent the die regions of the wafer from cracking, interlayer delamination or peeling.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
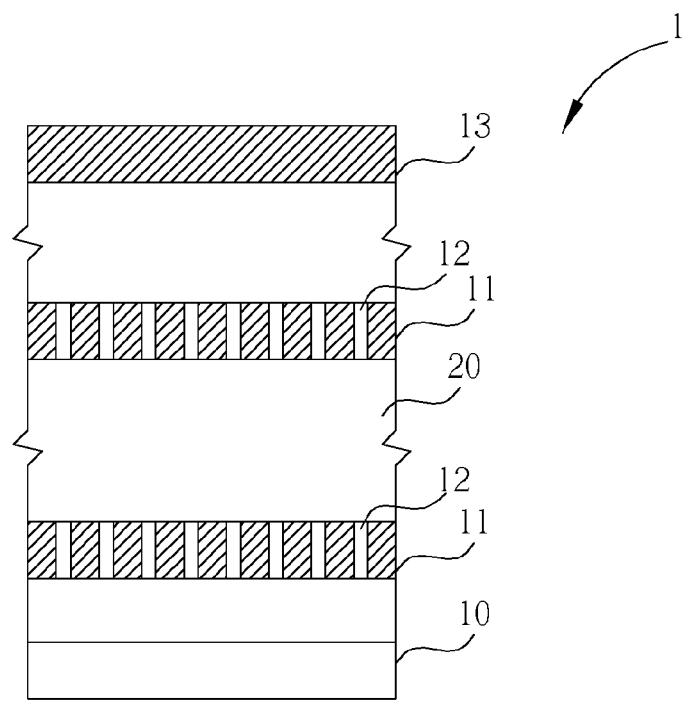
FIG. 1 to FIG. 4 schematically show cross sectional views of some conventional scribe line structures.
Figure 2:
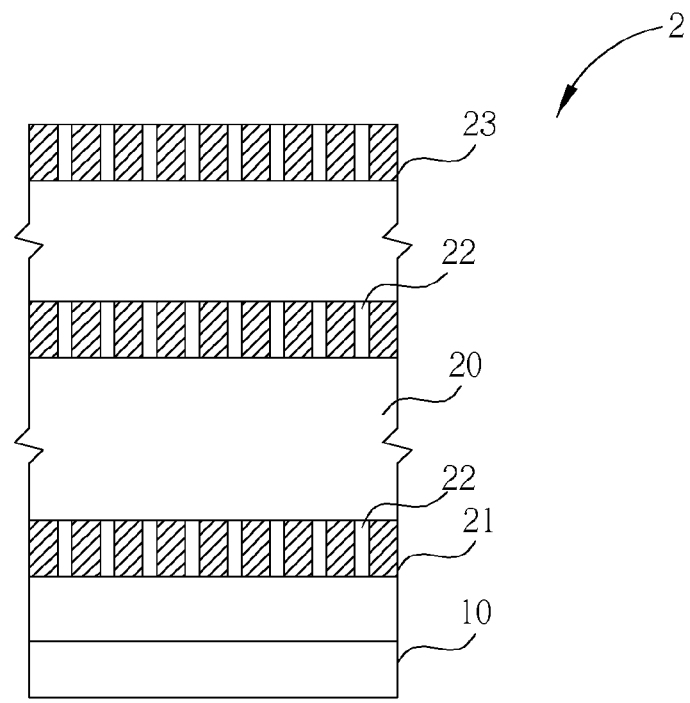
Figure 3:
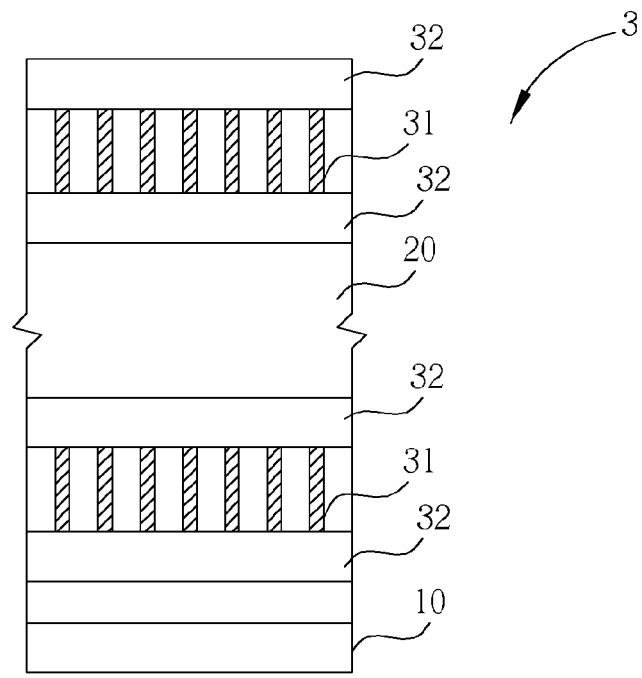
Figure 4:
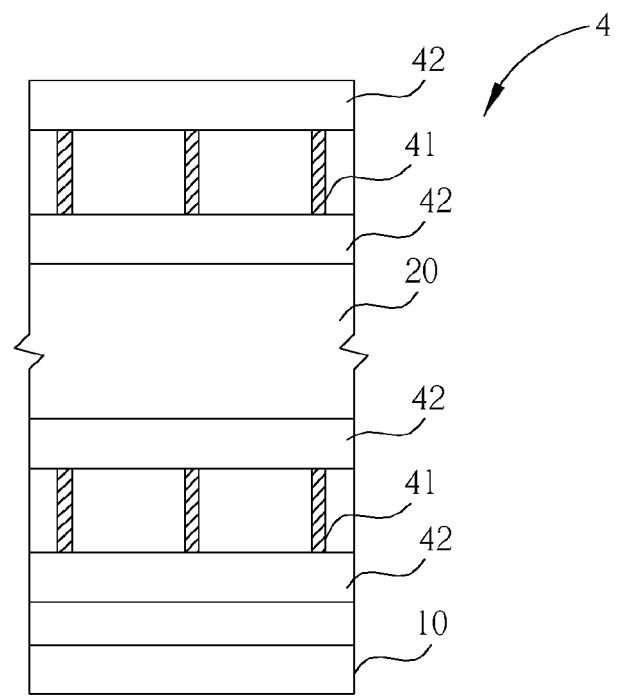
Figure 5:
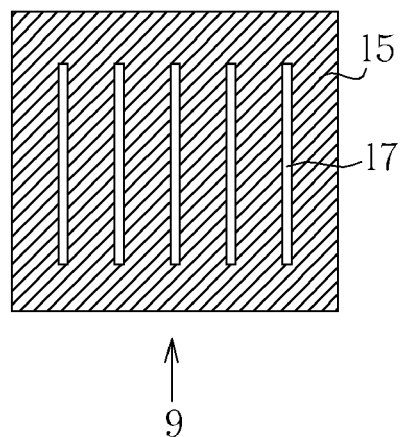
FIG. 5 shows a schematic top view of a conventional scribe line structure.
Figure 6:
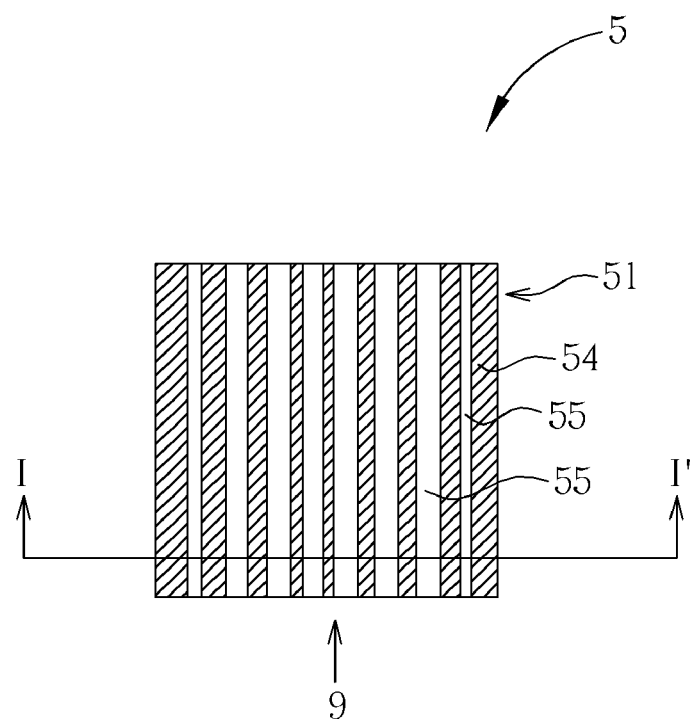
FIG. 6 shows a schematic top view of an embodiment of the scribe line structure for wafer dicing according to the present invention.
Figure 7:
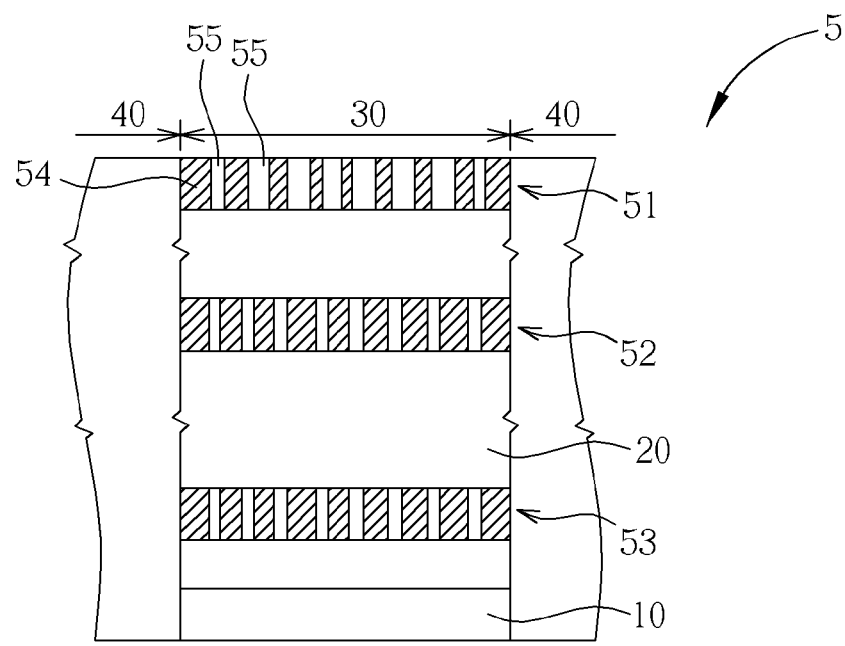
FIG. 7 shows a schematic cross-sectional view along the line II' of the scribe line structure shown in FIG. 6.

In one aspect, the scribe line structure for wafer dicing according to the present invention comprises a plurality of metal structures arranged up-and-down on a substrate in a dielectric layer and an upper one of the metal structures has a lower metal density than a lower one of the metal structures. FIG. 6 and FIG. 7 show an embodiment of the scribe line structure. FIG. 6 shows a schematic top view of a scribe line structure 5. FIG. 7 shows a schematic cross-sectional view along the line II' of the scribe line structure 5 shown in FIG. 6. The scribe line structure 5 is in the scribe line region 30 between two die regions 40 and comprises a substrate 10, a dielectric layer 20, and a plurality of metal structures (such as metal structures 51, 52, 53 exemplarily shown), arranged up-and-down on the substrate 10 in the dielectric layer 20. More specifically, the metal structure 51 is the topmost one, the metal structure 53 is the bottom one, and the metal structure 52 is one between the topmost one and the bottom one. Not all the metal layers are shown, and metal vias (if exist) are skipped over, for simplification and easy reading. Exemplarily, as shown in FIG. 6, the topmost metal structure 51 of the scribe line structure 5 comprises a metal layer 54. The metal layer 54 has a plurality of slots 55 which are parallel to the dicing direction 9 for the wafer dicing. Since the slots 55 are formed in the metal layer 54, the metal layer 54 is a metal pattern with metal line distribution. The metal structures are formed in such way to allow the metal density to be gradually increased from the topmost one to the bottom one. That is, the upper metal structure has a lower metal density than the lower metal structure. The means to attain such arrangement may be various. More slots with a same width or a same number of wider slots can get a more total slot area, resulting in a lower metal density. For example, as shown in FIG. 7, the metal layers of the metal structures, such as 51, 52, 53, may have a plurality of slots disposed in a same pitch, while the slots are wider for the upper one than the lower one, such that the metal portion in turn is sparser for the upper one than the lower one, and accordingly, the upper metal structure have a lower metal density than the lower metal structure, for example, the topmost metal structure 51 has a lower metal density than those underlying metal structures, including the metal structures 52 and 53, and the metal structure 52 has a lower metal density than those underlying metal structures, including the bottom metal structure 53.

Figure 8:
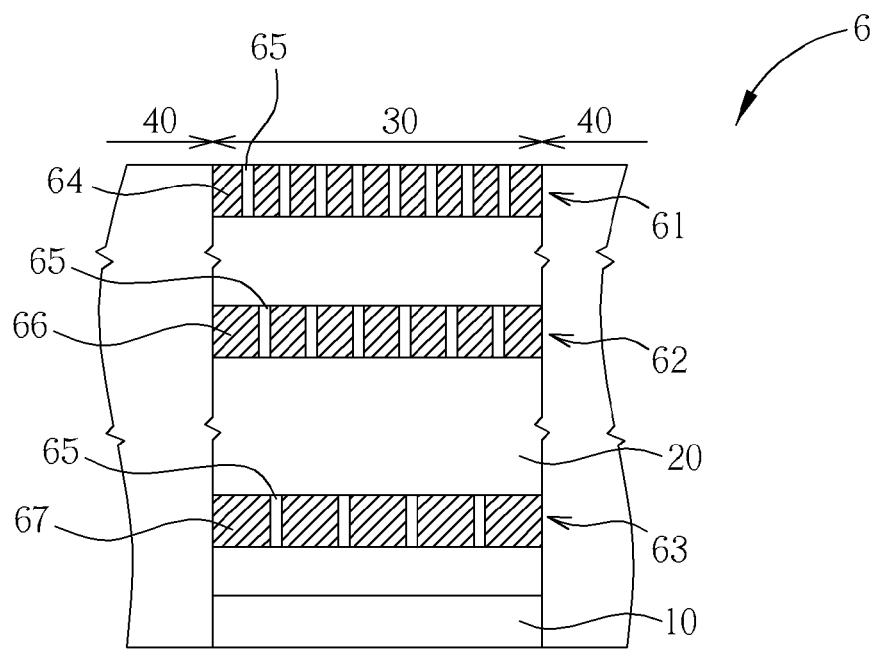
FIG. 8 shows another embodiment of the scribe line structure according to the present invention.

FIG. 8 shows another embodiment of the scribe line structure according to the present invention. The scribe line structure 6 is in the scribe line region 30 between two die regions 40 and comprises a substrate 10, a dielectric layer 20, and a plurality of metal structures (such as metal structures 61, 62, 63 exemplarily shown), arranged up-and-down on the substrate 10 in the dielectric layer 20. The metal layers of the metal structures 61, 62, and 63 each may have a plurality of slots 65 with a same width disposed in the metal layers 64, 66, and 67, while the number of the slots are greater for the upper one than the lower one, such that the metal portion in turn is sparser for the upper one than the lower one, and accordingly, the upper metal structure have a lower metal density than the lower metal structure. For example, the topmost metal structure 61 has a lower metal density than those underlying metal structures, including the metal structures 62 and 63, and the metal structure 62 has a lower metal density than those underlying metal structures, including the bottom metal structure 63.

It is noted that the widths of the slots of the metal structures are not particularly limited, as long as the arrangement of the slots can lead that the upper metal structure have a lower metal density than the lower metal structure. Furthermore, the metal layer with slots may be formed individually or spontaneously with the formation of the interconnect metal layers of die regions. Moreover, there may be metal vias disposed between two adjacent metal layers of the metal structures, and the metal via may be formed individually or spontaneously with the formation of the interconnect metal vias of die regions.

Alternatively, each of the metal structures may be a plurality of metal vias distributed in the dielectric layer, so as to allow the upper metal structure to have a lower metal density than the lower metal structure. The metal vias may be formed individually or spontaneously with the formation of the interconnect vias of die regions. Moreover, there may be a metal layer disposed between two adjacent metal structures comprising vias, and the metal layer may be formed individually or spontaneously with the formation of the interconnect metal layer of die regions.

Figure 9:
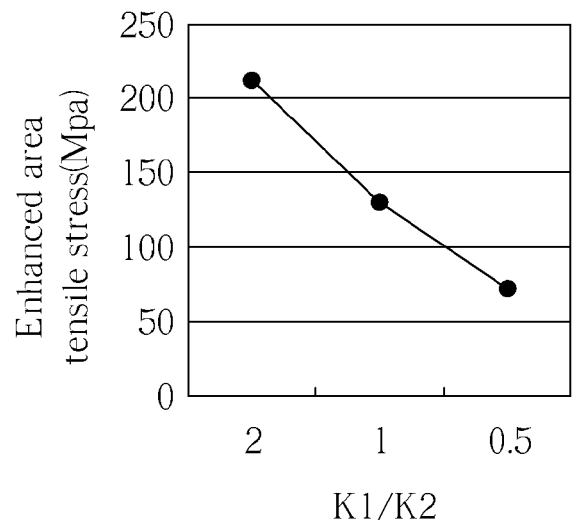
FIG. 9 is a simulation result showing a plot of tensile stress versus a relative stiffness for an embodiment of the scribe line structure according to the present invention.

FIG. 9 is a simulation result showing a plot of enhanced area tensile stress (MPa) versus a relative stiffness (K1/K2) for an embodiment of the scribe line structure according to the present invention. K1 is the stiffness of an upper metal structure, and K2 is the stiffness of a lower metal structure. It can be seen that the tensile stress is lower as K1/K2 is lower, and the lower stress results in no peeling or smaller peeling.

Figure 10:
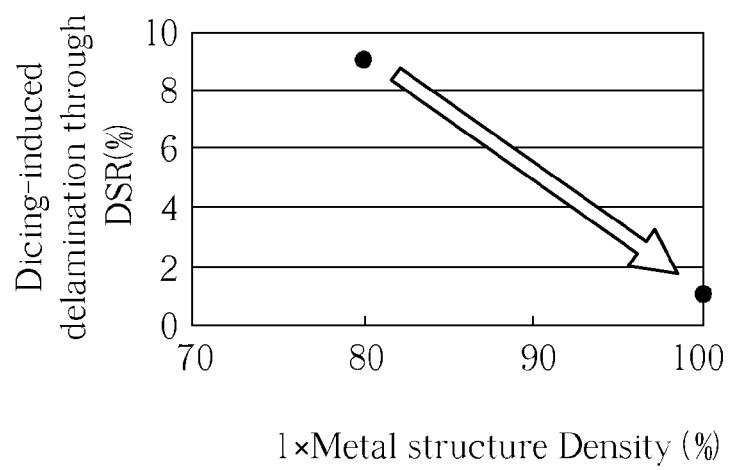
FIG. 10 shows a trend of a relation between the dicing included delamination through DSR (%) and 1× metal structure density (%) for an embodiment of the scribe line structure according to the present invention.

FIG. 10 shows a trend of a relation between the percentage of dicing-included delamination through die sealing ring (DSR) and the metal density (represented by %) of a metal structure between the topmost metal structure and the bottom metal structure (also referred to as 1× metal structure) for an embodiment of the scribe line structure according to the present invention. It can be seen that the more the 1× metal structure density, the lower the dicing-included delamination through DSR (%).

Figure 11:
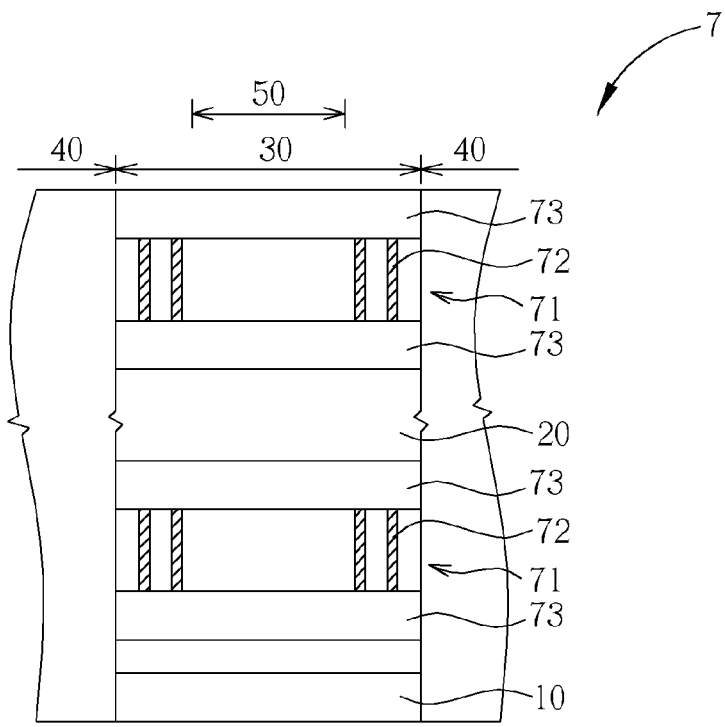
FIG. 11 shows a schematic cross-sectional view of another embodiment of the scribe line structure for wafer dicing according to the present invention.

In another aspect, the scribe line structure for wafer dicing includes a plurality of metal structures arranged up-and-down on a substrate in a dielectric layer, and each of the metal structures has a lower metal density on a dicing path for the wafer dicing than not on the dicing path. FIG. 11 shows a schematic cross-sectional view of a scribe line structure 7, another embodiment of the scribe line structure for wafer dicing according to the present invention. The scribe line structure 7 is in the scribe line region 30 between two die regions 40 and comprises a substrate 10, a dielectric layer 20, and a plurality of metal structures (such as two metal structures 71 exemplarily shown), arranged up-and-down on the substrate 10 in the dielectric layer 20. Each of the metal structures 71 comprises a set of metal vias 72 in the dielectric layer. The metal vias 72 are not disposed on the dicing path 50, but only disposed on both side regions adjacent to the dicing path 50, such that the metal structures 71 each have no metal on the dicing path 50 and a more metal density not on the dicing path 50. The metal vias 72 may be formed individually or spontaneously with the formation of the interconnect vias in the die regions. Metal layers 73 may be further formed between two adjacent metal structures and can be formed individually or spontaneously with the formation of the interconnect metal layers in the die regions.

Figure 12:
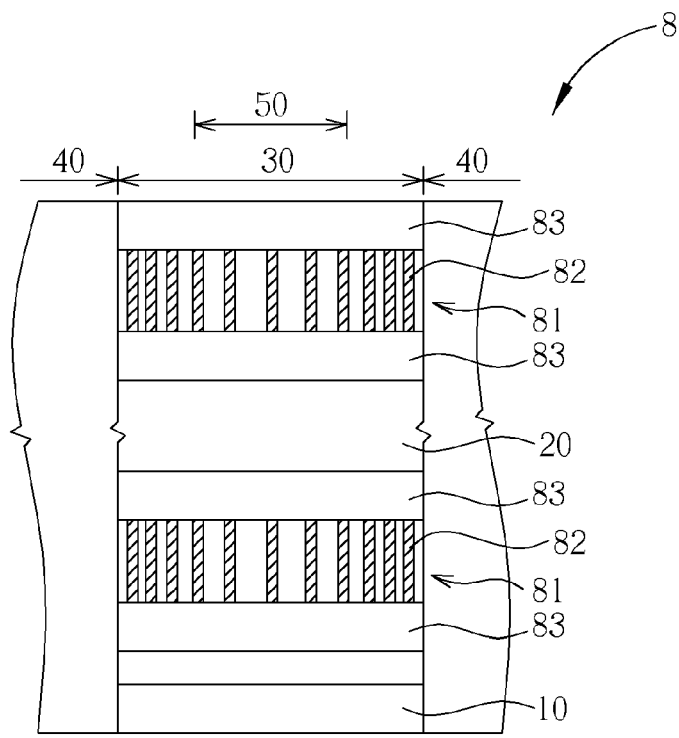
FIG. 12 shows a schematic cross-sectional view of still another embodiment of the scribe line structure for wafer dicing according to the present invention.

FIG. 12 shows a schematic cross-sectional view of a scribe line structure 8, still another embodiment of the scribe line structure for wafer dicing according to the present invention. The scribe line structure 8 is in the scribe line region 30 between two die regions 40 and comprises a substrate 10, a dielectric layer 20, and a plurality of metal structures (such as two metal structures 81 exemplarily shown), arranged up-and-down on the substrate 10 in the dielectric layer 20. Each of the metal structures 81 comprises a plurality of metal vias 82 in the dielectric layer. The metal structures 81 are similar to the metal structures 71. The metal vias 82 are disposed sparsely on the dicing path 50 and densely on both side regions adjacent to the dicing path 50 (i.e. not on the dicing path 50), such that the metal structures 81 each has a lower metal density on the dicing path 50 than not on the dicing path 50. Metal layers 83 may be further formed to contact the vias 82 as the interconnect metal layer in the die regions 40 are formed. There are not particular limitations to the metal layers 83 and the aforesaid metal layers 73. For example, they each may be a whole metal layer or a metal layer with slots.

It is noted that the metal density of the metal vias is not particularly limited, as long as the arrangement of the vias can lead a lower metal density on the dicing path than not on the dicing path. The metal density on the dicing path may be low to be zero.

Alternatively, the metal structures may each be a metal layer with slots parallel to the scribe line, and the slots are distributed to allow a lower metal density on the dicing path than not on the dicing path, for example, more total slot area results in a lower metal density. More slots with a same width or a same number of wider slots get a more total slot area. The metal layer may be formed individually or spontaneously with the formation of the interconnect metal layer of die regions. Moreover, there may be a metal vias disposed between two adjacent such metal structures, and the metal vias may be formed individually or spontaneously with the formation of the interconnect vias of die regions.

Figure 13:
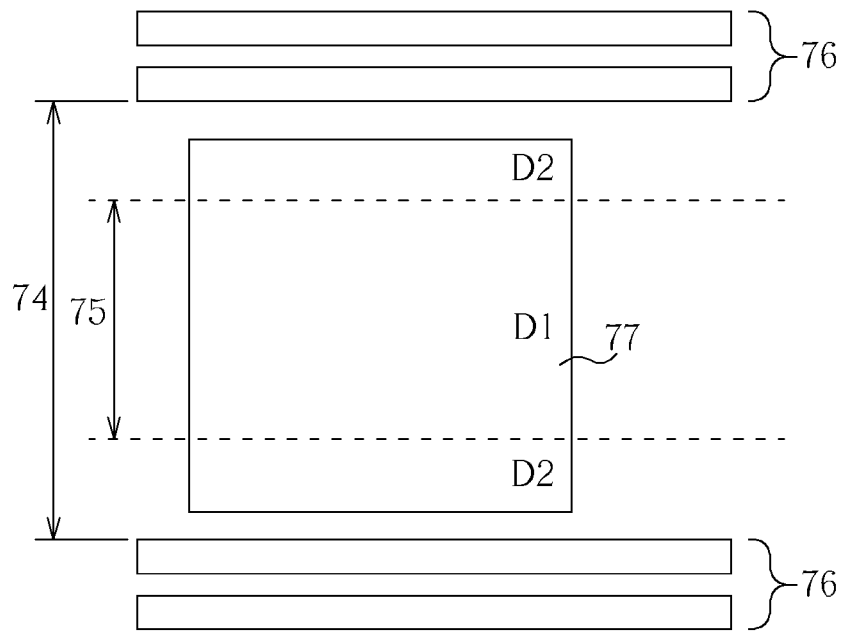
FIG. 13 shows a schematic top view of a scribe line structure of the present invention with a wafer acceptance test (WAT) pad thereon.

FIG. 13 shows a schematic top view of a scribe line structure of the present invention with a WAT pad thereon. A scribe line structure area 74 is between two die sealing ring structures 76, and a dicing path 75 is also set between the two die sealing ring structures 76 and narrower than the scribe line structure area 74. Thus, a D1 area of the scribe line structure area 74 is on the dicing path 75, and D2 areas of the scribe line structure area 74 are not on the dicing path 75. A WAT pad 77 is disposed on the top of the scribe line structure to partially cover the D1 area and the D2 areas.

Figure 14:
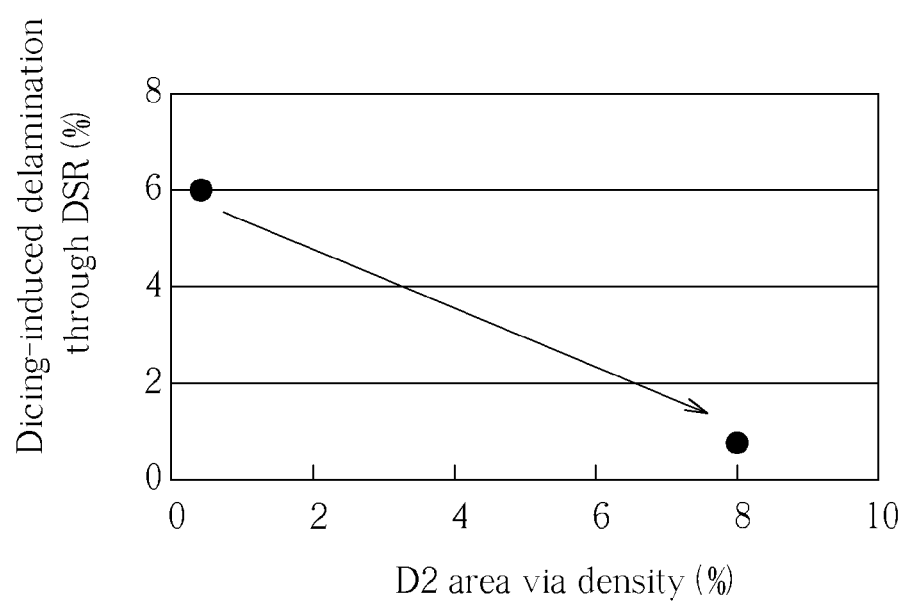
FIG. 14 shows a trend of a relation between the percentage of dicing included delamination through DSR and the percentage of D2 area via density for an embodiment of the scribe line structure according to the present invention.

FIG. 14 shows a trend of a relation between the percentage of dicing-included delamination through DSR and the D2 area via density (represented by %) for an embodiment of the scribe line structure according to the present invention. When the D2 area via density is 0, it means no vias existing. It is clear that as D2 area via density is high, the dicing-induced delamination through DSR(%) is largely reduced. Thus, it can be noted that when D2 area via density/D1 area via density is large, the stress is largely retarded.

Either the scribe line structure including metal structures in which an upper one has a lower metal density than a lower one, or a scribe line structure including metal structures in which the metal density on a dicing path is lower than that not on the dicing path, provides good dicing properties. Such two features also can be combined to allow a scribe line structure to include metal structures alternately comprising metal layers and metal vias, in which, the upper metal layer has a lower metal density than a lower one, and the metal density of the metal vias is lower on the dicing path than not on the dicing path.

The scribe line structure for wafer dicing may be formed simultaneously with the formation of the interlayer dielectric layers and the interconnect metal layers and vias, i.e., by the interconnect process. For example, in one embodiment, the metal structure comprises both metal layers and sets of metal vias which may be alternately formed in the dielectric layers. A damascene process or dual damascene process may be utilized for the formation of the metal layers and the metal vias, but not limited thereto. The metal layers and the metal vias may comprise copper. The advantage will more clearly shown when the scribe line structure for wafer dicing according to the present invention are utilized in the 45 nm technology or beyond, and especially when the lower portion of the interconnect dielectric layer comprises low-k dielectric material.

All combinations and sub-combinations of the above-described features also belong to the present invention. Those skilled in the art will readily observe that numerous modifications and alterations of the device and method may be made while retaining the teachings of the invention.

What is claimed is:

1. A scribe line structure for wafer dicing, comprising:
   a substrate;
   a dielectric layer disposed on the substrate; and
   a plurality of metal structures arranged up-and-down on the substrate in the dielectric layer, wherein an upper one of the metal structures has a lower metal density than a lower one of the metal structures, there is a vertical distance between two successive ones of the metal structures, no other metal structure is disposed between the two successive ones of the metal structures, and at least one of the metal structures comprises a first metal layer having at least three slots parallel to a dicing direction.

2. The scribe line structure for wafer dicing of claim 1, wherein the lower metal density is attained by allowing the upper one of the metal structures to be the at least one of the metal structures or to comprise a second metal layer having a plurality of slots parallel to a dicing direction, and the upper one of the metal structures has the lower metal density than the lower one of the metal structures.

3. The scribe line structure for wafer dicing of claim 1, wherein each of the metal structures comprises a plurality of metal vias, and the upper one of the metal structures has the lower metal density than the lower one of the metal structures.

4. The scribe line structure for wafer dicing of claim 1, wherein each of the metal structures comprises a plurality of metal vias and a third or the first metal layer, and the third or first metal layer is on or beneath the plurality of metal vias.

5. The scribe line structure for wafer dicing of claim 1, wherein the lower portion of the dielectric layer comprises a low-k dielectric material.

6. A scribe line structure for wafer dicing, comprising:
   a substrate;
   a dielectric layer disposed on the substrate; and
   a plurality of metal structures arranged up-and-down on the substrate in the dielectric layer, wherein an upper one of the metal structures has a lower metal density than a lower one of the metal structures, there is a vertical distance between two successive ones of the metal structures, and no other metal structure is disposed between the two successive ones of the metal structures, each of the metal structures comprises a metal layer having one or a plurality of slots parallel to a dicing direction, and the number of the slot or slots of each of the metal structures is different from each other.

* * * * *